(12) United States Patent
Kuang et al.

(10) Patent No.: US 10,514,403 B2
(45) Date of Patent: Dec. 24, 2019

(54) CAPACITANCE MEASURING CIRCUIT AND CAPACITANCE MEASURING METHOD

(71) Applicant: Raydium Semiconductor Corporation, Hsinchu (TW)

(72) Inventors: Yu Kuang, Hsinchu (TW); Tsung-Yi Su, New Taipei (TW); Shih-Chin Chang, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 98 days.

(21) Appl. No.: 15/830,032

(22) Filed: Dec. 4, 2017

(65) Prior Publication Data

US 2018/0156853 A1 Jun. 7, 2018

(30) Foreign Application Priority Data

Dec. 2, 2016 (TW) .............................. 105139968 A

(51) Int. Cl.
| | | |
|---|---|---|
| *G01R 27/26* | (2006.01) | |
| *G06F 3/044* | (2006.01) | |
| *G01C 1/00* | (2006.01) | |

(52) U.S. Cl.
CPC .......... *G01R 27/2605* (2013.01); *G06F 3/044* (2013.01)

(58) Field of Classification Search
CPC .......... G01C 1/00; G06K 1/00; G06K 2207/00
See application file for complete search history.

(56) References Cited

U.S. PATENT DOCUMENTS

| | | | | |
|---|---|---|---|---|
| 8,779,783 | B1* | 7/2014 | Liepold | G06F 3/016 324/658 |
| 2012/0043971 | A1* | 2/2012 | Maharyta | G01R 27/2605 324/658 |
| 2012/0313701 | A1* | 12/2012 | Khlat | H02M 3/07 330/127 |
| 2015/0212650 | A1* | 7/2015 | Noto | G06F 3/0418 345/174 |
| 2015/0253372 | A1* | 9/2015 | Watanabe | G01N 27/223 324/538 |
| 2015/0346236 | A1* | 12/2015 | Flamm | G01P 15/125 73/514.32 |
| 2017/0090615 | A1* | 3/2017 | Bohannon | G06F 3/044 |

* cited by examiner

*Primary Examiner* — Huy Q Phan
*Assistant Examiner* — Temilade S Rhodes-Vivour

(57) ABSTRACT

A circuit and method of measuring capacitance are disclosed. The capacitance measuring circuit includes an integrator circuit, a first control circuit, a second control circuit and a processor circuit. The capacitance measuring method includes steps of: using a current source and a charging/discharging time to generate a first charge amount related to a second charge amount of a capacitor to be detected; generating a third charge amount and generating a fourth charge amount according to the first charge amount and the third charge amount; generating a fifth charge amount and generating a remaining charge amount according to the fifth charge amount and fourth charge amount; using an integrator to convert the remaining charge amount into a first voltage and generating a judging result according to whether the first voltage meets a second voltage; and calculating the judging result to obtain a capacitance variation of the capacitor to be detected.

11 Claims, 10 Drawing Sheets

CAPACITANCE MEASURING CIRCUIT AND CAPACITANCE MEASURING METHOD

BACKGROUND OF THE INVENTION

1. Field of the Invention

The invention relates to a capacitor; in particular, to a capacitance measuring circuit and a capacitance measuring method.

2. Description of the Prior Art

Since capacitive touch panels and capacitive fingerprint identification devices have been widely used in today's electronic products, the technologies of detecting capacitance variations have become more and more important. In the prior arts, such as patents of TW 1361280 and U.S. Pat. No. 8,134,374 (as shown in FIG. 1A and FIG. 1B respectively), in order to remove most of the basic capacitance and keep most of the detection range of the detection module to detect the real capacitance variations, the capacitance compensation circuit is usually used to cancel off most of the charges induced by the basic capacitance.

For example, Cx in FIG. 1A represents the basic capacitance of the capacitor to be detected. In order to cancel off most of the charges induced by the basic capacitance, the switch SW2 in the capacitance compensation circuit is switched to make the voltage variation at one terminal of the compensation capacitor Cadj opposite to the voltage variation at one terminal of the capacitor Cx to be detected and the control signal Sadj is used to adjust the compensation capacitor Cadj, so that most of the charges at the output terminal ndo and the input terminal ndi of the integrator circuit induced by the capacitor Cx to be detected will be cancelled off by the charges with opposite polarization induced by the compensation capacitor Cadj. As shown in FIG. 1A, when the clock signal CK_a1 is 1, one terminal nd2 of the compensation capacitor Cadj is charged to the voltage level Vf2 and one terminal nd1 of the capacitor Cx to be detected is discharged to the voltage level Vf1; when the clock signal CK_a2 is 1, the positive charges of the compensation capacitor Cadj will be cancelled off by the negative charges of the capacitor Cb2 to be detected; therefore, most of the basic capacitance will be removed.

Since the parasitic capacitance of the in-cell capacitive touch panel or the large-sized capacitive touch panel is large, e.g., in a range of 100 pF~1000 pF, when the capacitance of the in-cell capacitive touch panel or the large-sized capacitive touch panel is detected, the parasitic capacitance of the touch panel not touched will become the basic capacitance (e.g., Cx in FIG. 1A). Since the capacitive touch apparatus detects the capacitance variations before and after the touch panel is touched and determines whether the touch panel is touched and the touched positions on the touch panel, if the capacitive touch apparatus is applied to the in-cell capacitive touch panel or the large-sized capacitive touch panel, there will be large basic capacitance to be cancelled off and the capacitance of the compensation capacitor (e.g., Cadj in FIG. 1A) needed will be also larger. Therefore, the volume and the cost of the detection apparatus will be increased. If the detection apparatus is an integrated circuit, the area of the compensation capacitor in the integrated circuit will be increased and the cost will be also increased.

SUMMARY OF THE INVENTION

Therefore, the invention provides a capacitance measuring circuit and a capacitance measuring method to overcome the above-mentioned problems in the prior art.

An embodiment of the invention is a capacitance measuring circuit. In this embodiment, the capacitance measuring circuit includes an integrator circuit, a first control circuit, a second control circuit and a processor circuit. The integrator circuit includes a first input terminal and a first output terminal, wherein there is an integral voltage on the first output terminal, the integrator circuit is used to respond to an enable level of a first control signal, and the integral voltage is set a starting level. The first control circuit includes a second output terminal, a capacitor to be detected and a current source circuit, wherein the second output terminal is electrically connected to the first input terminal, the current source circuit responds to a signal value of a setup signal to determine an equivalent current value related to an original capacitance before the capacitor to be detected is changed, the first control circuit is used to respond to a first set of clock signals to switch a voltage level on at least one terminal of the capacitor to be detected and conduct a current of the current source circuit to the second output terminal to perform a first adjusting operation. The second control circuit includes a third output terminal and a known capacitor, wherein the third output terminal is electrically connected to the first input terminal, and the second control circuit is used to respond to a first set of clock signals to switch a voltage level on at least one terminal of the known capacitor to perform a second adjusting operation. The processor circuit is electrically connected to the first control circuit and the second control circuit and used for driving the first control circuit and the second control circuit to perform the first adjusting operation and the second adjusting operation respectively and calculating a number of times the second control circuit performs the second adjusting operation during a first integral period, and then obtaining a capacitance variation of the capacitor to be detected according to the number of times and the capacitance of the known capacitor.

In an embodiment, the first adjusting operation is to adjust the integral voltage to a sum of a current level of the integral voltage and a first voltage difference.

In an embodiment, the first voltage difference is related to a difference between the capacitance of the capacitor to be detected and a product of the equivalent current value and a charging/discharging time.

In an embodiment, the second adjusting operation is to adjust the integral voltage to a sum of a current level of the integral voltage and a second voltage difference.

In an embodiment, the processor circuit provides a first set of clock signals and a second set of clock signals to drive the first control circuit and the second control circuit to perform the first adjusting operation and the second adjusting operation respectively.

In an embodiment, the processor circuit provides a first set of clock signals and a second set of clock signals to drive the first control circuit and the second control circuit to perform the first adjusting operation and the second adjusting operation respectively.

Another embodiment of the invention is a capacitance measuring method. In this embodiment, the capacitance measuring method includes steps of: using a current source and a charging/discharging time to generate a first charge amount related to a second charge amount of a capacitor to be detected; generating a third charge amount and generating a fourth charge amount according to the first charge amount and the third charge amount, wherein the third charge amount is related to the capacitor to be detected; generating a fifth charge amount and generating a remaining charge amount according to the fifth charge amount and the fourth charge amount; using an integrator to convert the remaining charge amount into a first voltage and generating a judging result according to whether the first voltage meets a second voltage; and calculating the judging result to obtain a capacitance variation of the capacitor to be detected.

Compared to the prior arts, the capacitance measuring circuit and the capacitance measuring method of the invention uses the compensation current instead of the compensation capacitor, since the area of the current circuit is smaller than the area of the capacitor in the integrated circuit and the charge amount provided by the current circuit will be proportional to the current input/output time; therefore, the current that the current source should provide can be reduced by suitably controlling the switching time of the current source and increasing the current input/output time. Once the current source provides smaller current, the area of the current circuit can become smaller accordingly to largely reduce the area of the integrated circuit.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

A preferred embodiment of the invention is a capacitance measuring circuit. In this embodiment, the capacitance measuring circuit can be applied to the capacitive touch panel, but not limited to this.

Figure 1A:
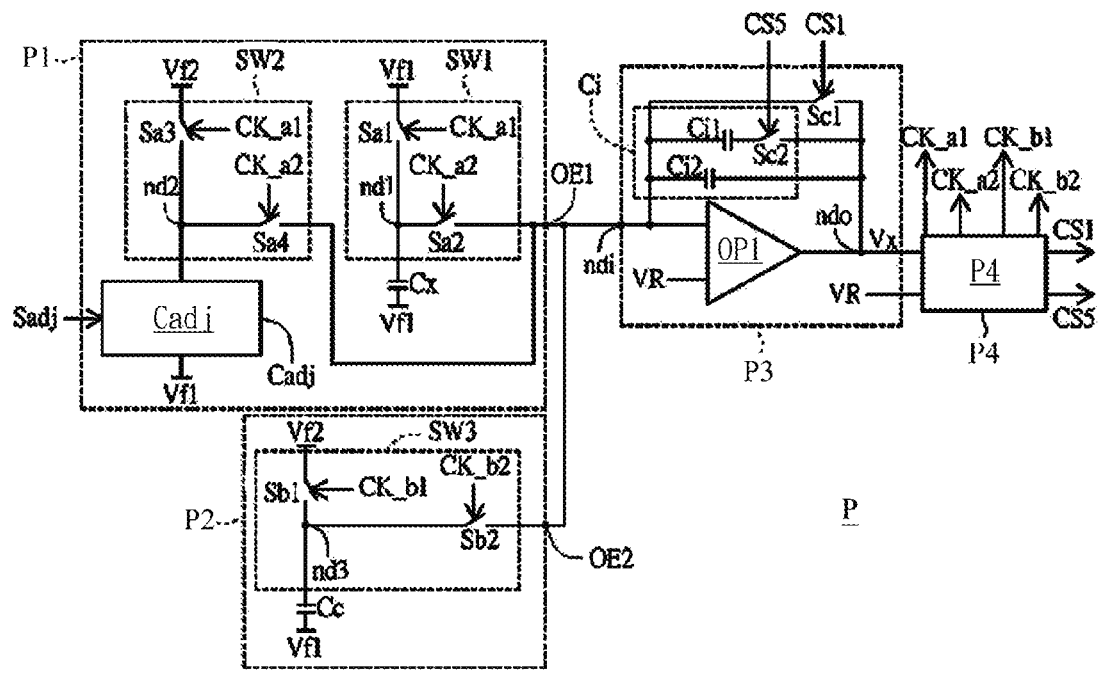
FIG. 1A and FIG. 1B illustrate a schematic diagram of the capacitance measuring circuit and a timing diagram of the related signals in the prior arts respectively.
Figure 1B:
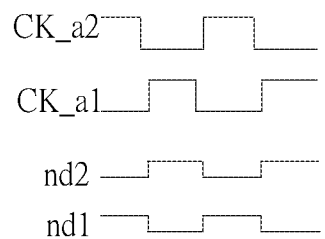
Figure 2A:
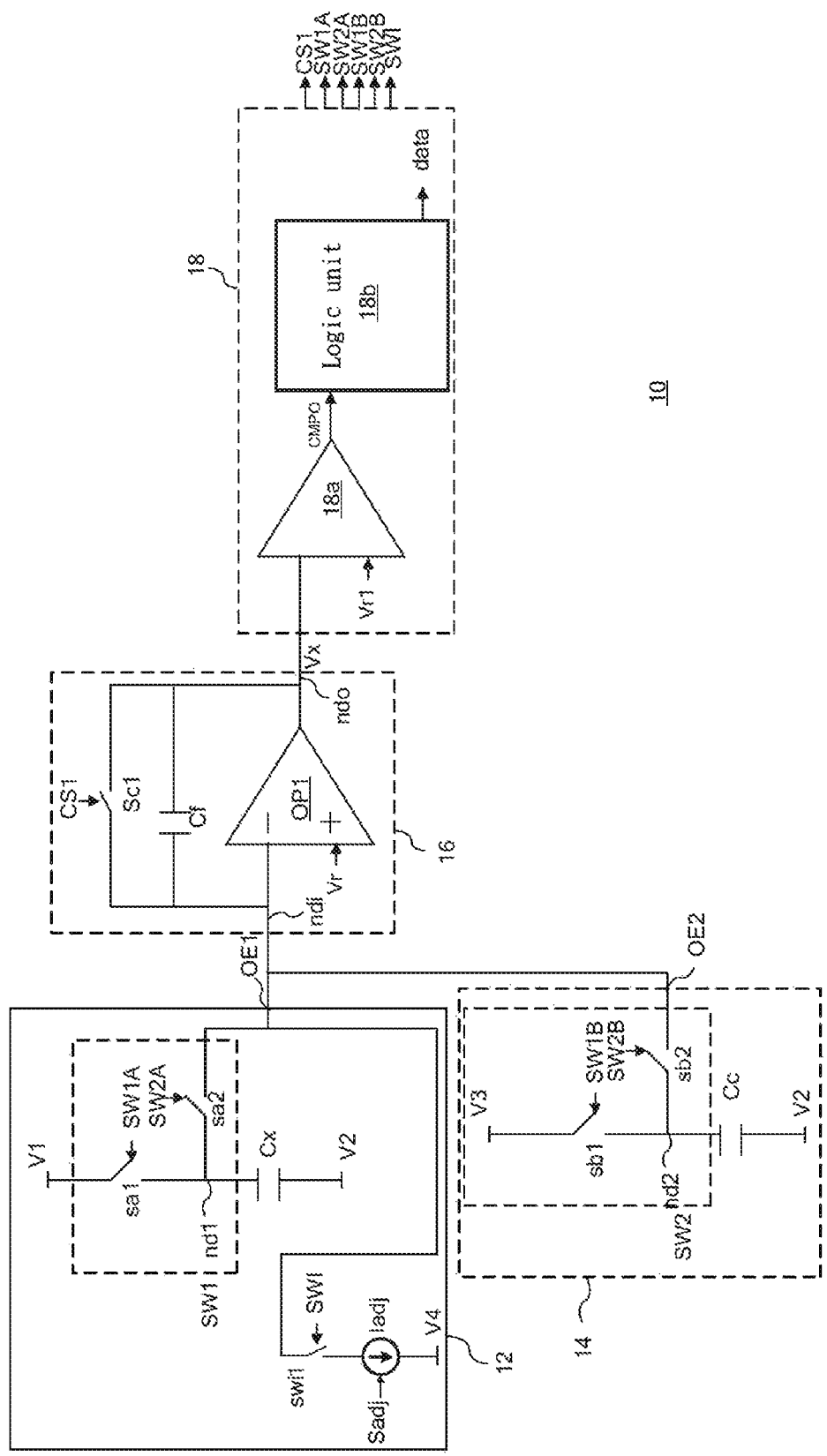
FIG. 2A illustrates a functional block diagram of the capacitance measuring circuit in the first embodiment of the invention.

Please refer to FIG. 2A. FIG. 2A illustrates a schematic diagram of the capacitance measuring circuit in this embodiment. As shown in FIG. 2A, the capacitance measuring circuit 10 includes a first control circuit 12, a second control circuit 14, an integrator circuit 16 and a processor circuit 18. The first control circuit 12 and the second control circuit 14 are used to control the integrator circuit 16 to set the integral voltage Vx as the end level from the starting level and set the integral voltage Vx as the approximative starting level from the end level. For example, the starting level is equal to the reference voltage Vr and the level of the end level is lower than the starting level.

The processor circuit 18 is used to generate a corresponding signal to drive the first control circuit 12, the second control circuit 14 and the integrator circuit 16 to perform the above-mentioned operations and to respond the level variation of the integral voltage Vx to perform operation on the capacitance of the capacitor Cx to be detected and the operation result is the data signal data.

Next, the operations of the components in the capacitance measuring circuit 10 will be introduced in detail.

The integrator circuit 16 includes an input terminal ndi, an output terminal ndo, a switch Scl, an integral capacitor Cf and an operational amplifier OP1. There is an integral voltage Vx on the output terminal ndo. Two terminals of the switch Scl and two terminals of the integral capacitor Cf are coupled across the negative input terminal and the output terminal ndo of the operational amplifier OP1. The switch Scl is enabled by the control signal CS1. The positive input terminal of the operational amplifier OP1 receives the reference voltage Vr. Wherein, the reference voltage Vr can be any specific reference voltage between the maximum voltage VDD and the ground voltage of the capacitance measuring circuit 10 in this embodiment. For example, the reference voltage Vr can be equal to VDD/2, namely half of the maximum voltage, but not limited to this.

The control circuit 12 includes an output terminal OE1, a switch circuit SW1, a switch swi1, a capacitor Cx to be detected and a current source circuit Iadj. The switch circuit SW1 includes switches Sa1 and Sa2. One terminal of the switch Sa1 is coupled to the node nd1 and another terminal of the switch Sa1 is configured to receive the voltage V1. One terminal of the switch Sa2 is coupled to the node nd1 and another terminal of the switch Sa2 is coupled to the negative input terminal of the operational amplifier OP1. The switches Sa1 and Sa2 are conducted by the enabling clock signals SW1A and SW2A respectively. Two terminals of the capacitor Cx to be detected are coupled to the node nd1 and receive the voltage V2 respectively. For example, the voltage V1 can be the maximum voltage VDD and the voltage V2 can be the ground voltage.

One terminal of the switch swi1 is coupled to the current source circuit Iadj and another terminal of the switch swi1 is coupled to the negative input terminal of the operational amplifier OP1. The switch swi1 is conducted by the enabling clock signal SWI. Two terminals of the current source circuit Iadj are coupled to one terminal of the switch swi1 and receive the voltage V4 (e.g., the ground voltage) respectively. The current source circuit Iadj responds the signal value of the setup signal Sadj to determine the equivalent current value. The equivalent current value I1 of the current source circuit Iadj set by the setup signal Sadj is practically related to the capacitance of the capacitor to be detected before the capacitor to be detected is changed. In this embodiment, the charge value represented by the product of the equivalent current value I1 of the current source circuit Iadj and a charging/discharging time (e.g., the time that the clock signal SWI enables the switch swi1) is smaller but near the charge value represented by the product of the capacitance of the capacitor Cx to be detected and the voltage difference (VDD-Vr).

The control circuit 14 includes the output terminal OE2, the switch circuit SW2 and the known capacitor Cc. The control circuit 14 is coupled to the node nd2. The switch circuit SW2 includes the switches sb1 and sb2. One terminal of the switch Sb1 is coupled to the node nd2 and another terminal of the switch Sb1 is configured to receive the voltage V3. One terminal of the switch Sb2 is coupled to the node nd2 and another terminal of the switch Sb2 is coupled to the negative input terminal of the operational amplifier OP1. The switches Sb1 and Sb2 are conducted by the enabling clock signals SW1B and SW2B respectively. Two terminals of the known capacitor Cc are coupled to the node nd2 and receive the voltage V2 respectively.

Figure 2B:
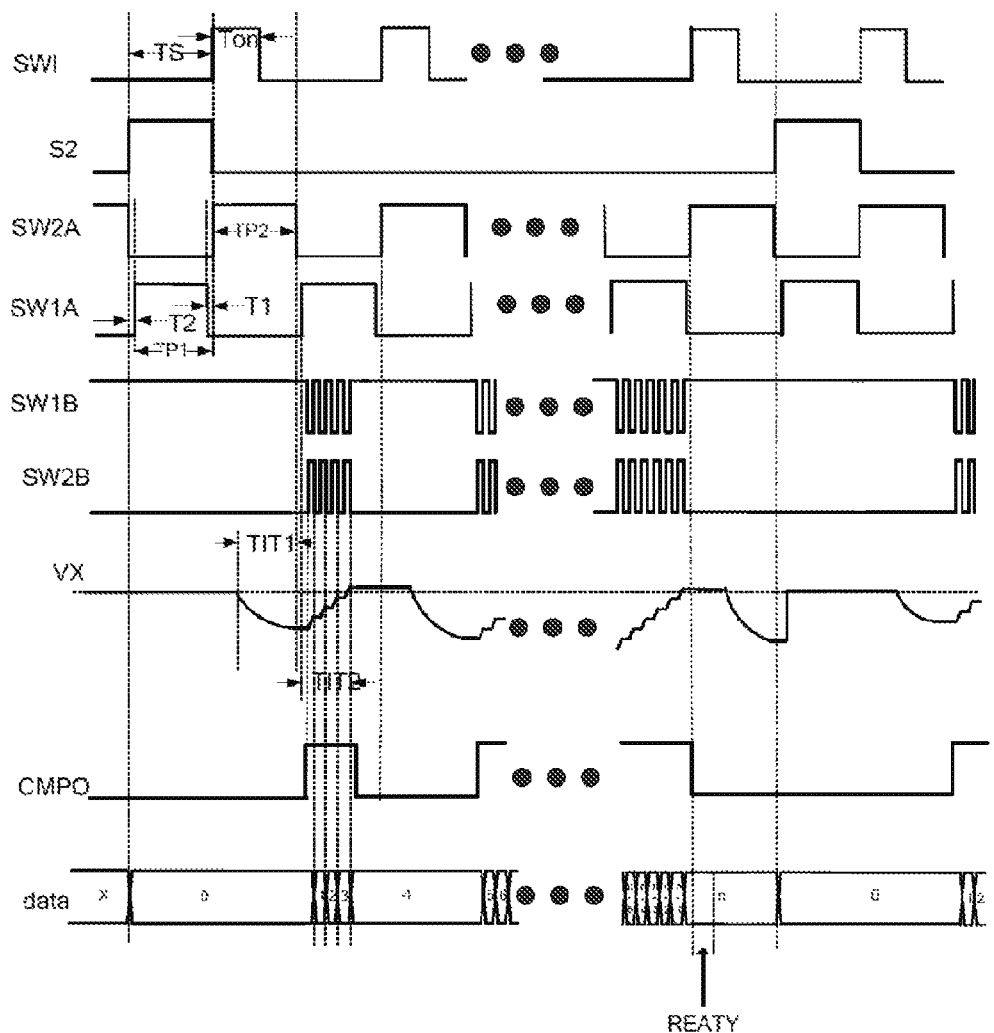
FIG. 2B illustrates a timing diagram of the related signals in the capacitance measuring circuit 10 in FIG. 2A.

Please refer to FIG. 2B. FIG. 2B illustrates a timing diagram of the related signals in the capacitance measuring circuit 10 in FIG. 2A. In this embodiment, the capacitance measuring circuit 10 includes the voltage setup period TS and the integral periods TIT1 and TIT2.

During the voltage setup period TS, the control signal CS1 is enabled to conduct the switch sc1. Thus, the operational amplifier OP1 is practically biased as a unit gain buffer. The positive input terminal, the voltage (e.g., the integral voltage Vx) on the negative input terminal and the output terminal ndo of the operational amplifier OP1 is set as the reference voltage Vr.

During the integral period TIT1, the switches Sa1 and Sa2 are correspondingly conducted by the clock signals SW1A and SW2A. During the first sub-operation period, the clock signals SW1A and SW2A are high-level and low-level respectively. During the second sub-operation period, the clock signals SW1A and SW2A are low-level and high-level respectively. The first sub-operation period and the second sub-operation period equal to the positive half cycle of the clock signal SW1A and the positive half cycle of the clock signal SW2A respectively. After each cycle of the clock signal SW1A, the integral circuit 16 finishes one integral operation on the integral voltage Vx.

In detail, during the first sub-operation period TP1, the switch Sa1 is conducted and the switch Sa2 is switched off; the voltage across two terminals of the integral circuit Ci is 0 volt and the voltage across two terminals of the capacitor Cx to be detected is (V1-V2) volt, for example, the maximum voltage VDD. The switch swi1 is also switched off during the first sub-operation period TP1, and the current of the current source circuit Iadj will not charge or discharge the node OE1. During the second sub-operation period TP2, the switch Sa1 is switched off and the switch Sa2 is conducted. The total charge amount stored by the capacitor Cx to be detected and the integral capacitor Cf during the first sub-operation period TP1 is equal to the total charge amount stored by the capacitor Cx to be detected and the integral capacitor Cf during the second sub-operation period TP2 and the charge value represented by the product of the equivalent current value I1 of the current source circuit Iadj and the charging/discharging time Ton (e.g., the time that the clock signal SWI enables the switch swi1), namely satisfying the following equation (1):

$$Cx \times (V1-V2) + Cf \times [Vr-Vx(t0)] = Cx \times (Vr-V2) + I1 \times Ton + Cf \times [Vr-Vx(t1)] \quad (1)$$

Wherein, the left part of the equation (1) is the total charge amount stored by the capacitor Cx to be detected and the integral capacitor Cf during the first sub-operation period TP1; the right part of the equation (1) is the total charge amount stored by the capacitor Cx to be detected and the integral capacitor Cf during the second sub-operation period TP2 and the charge value represented by the product of the equivalent current value I1 of the current source circuit Iadj and the charging/discharging time Ton (e.g., the time that the clock signal SWI enables the switch swi1). The voltage level Vx(t0) is the starting level of the integral voltage Vx (practically equal to the reference voltage Vr). If the reference voltage Vr equals to the average voltage of the voltages V1 and V2, then the following equations (2) and (3) can be obtained according to the equation (1):

$$Vx(t1) = \frac{1}{Cf} \times \left[\frac{(V2-V1)}{2} \times Cx + (I1 \times Ton)\right] + Vr \quad (2)$$

$$\Delta V1 = \quad (3)$$
$$Vx(t1) - Vx(t0) = \frac{1}{Cf} \times \left[\frac{(V2-V1)}{2} \times Cx + (I1 \times Ton)\right] + Vr - Vr =$$
$$\frac{Cx \times (V2-V1) + 2(I1 \times Ton)}{2 \times Cf}$$

According to the above-mentioned derivations, after one integral operation is performed, the integral voltage Vx is practically changed a voltage difference $\Delta V1$, so that the integral voltage Vx is changed from the starting level (=the reference voltage Vr) to the end level Vx(t1).

During the integral period TIT2, the clock signals SW1B and SW2B drive the control circuit 14 to perform the operation similar to the control circuit 12 to integrate the integral voltage Vx. If V3=V2, then the voltage difference $\Delta V2$ satisfies the following equation (5):

$$\Delta V2 = \frac{Cc \times (V1-V2)}{2 \times Cf} \quad (5)$$

According to the above-mentioned derivations, after one integral operation is performed, the integral voltage Vx is practically changed a voltage difference $\Delta V2$. In this embodiment, the integral period TIT2 can include the cycles of M1 clock signals SW1B. During these cycles of the clock signals SW1B, the control circuit 14 and the integral circuit 16 perform similar integral operations, M1 is a natural number. Thus, after the above-mentioned integral operation is performed M1 times, the integral voltage Vx will be increased from the end level Vx(t1) to be larger than the reference voltage Vr1 and near the reference voltage Vr1. In this embodiment, the reference voltage Vr1 is equal to the starting reference voltage Vr. In this embodiment, the comparator 18a in the processor circuit 18 will provide the output signal CMPO to inform the logic unit 18b that the integral voltage Vx is increased from the end level Vx(t1) to be larger than the reference voltage Vr1 and near the reference voltage Vr1, namely the following equation (6) is satisfied:

$$Vr = Vx(t1) + M1 \times \Delta V2 = \frac{1}{Cf} \times \left[\frac{(V2-V1)}{2} \times Cx + (I1 \times Ton)\right] + \quad (6)$$
$$Vr + M1 \times \left[\frac{Cc \times (V1-V2)}{2 \times Cf}\right]$$

After the equation (6) is organized, the equation (7) related to the relationships among the capacitor Cx to be detected, the equivalent current value I1 of the current source circuit Iadj, the charging/discharging time Ton, the values M1, N and the known capacitor Cc can be obtained as follows:

$$Cx - 2 \times \frac{(I1 \times Ton)}{(V1 - V2)} = M1 \times Cc \quad (7)$$

After the above-mentioned integral operations during the integral periods TIT1 and TIT2 are performed N times (N is a nature number), the equation (8) related to the relationships among the capacitor Cx to be detected, the equivalent current value I1 of the current source circuit Iadj, the charging/discharging time Ton, the values M1~MN, N and the known capacitor Cc can be obtained as follows:

$$Cx - 2 \times \frac{(I1 \times Ton)}{(V1 - V2)} = \frac{\left(\sum_{j=1}^{N} M_j\right) \times Cc}{N} \quad (8)$$

Thus, the processor circuit 18 can obtain the capacitance of the capacitor Cx to be detected according to the equivalent current value I1 of the current source circuit Iadj, the charging/discharging time Ton, the values M1~MN, N and the known capacitor Cc in the above-mentioned equations. In this embodiment, the logic unit 18b in the processor circuit 18 can count the number of the times that the output result of the comparator is "1" every time when the cycle of the clock signal SW1B is over during the N integral periods TIT2, namely the sum of M1~MN, and output the data signal data. Since the relationship between the capacitance of the capacitor Cx to be detected and the sum of M1~MN can be found according to the equation (8), the capacitance of the capacitor Cx can be determined according to the value of the output data signal data. In addition, since the equivalent current value I1 of the current source circuit Iadj set by the setup signal Sadj is practically related to the capacitance of the capacitor Cx to be detected before the capacitor Cx to be detected is changed, and the left part of the equation (8) approaches 0, so that most of the capacitor Cx to be detected will be canceled off, and most detection range of this capacitive detection apparatus can be used to detect the capacitance change of the capacitor Cx to be detected later.

Figure 2C:
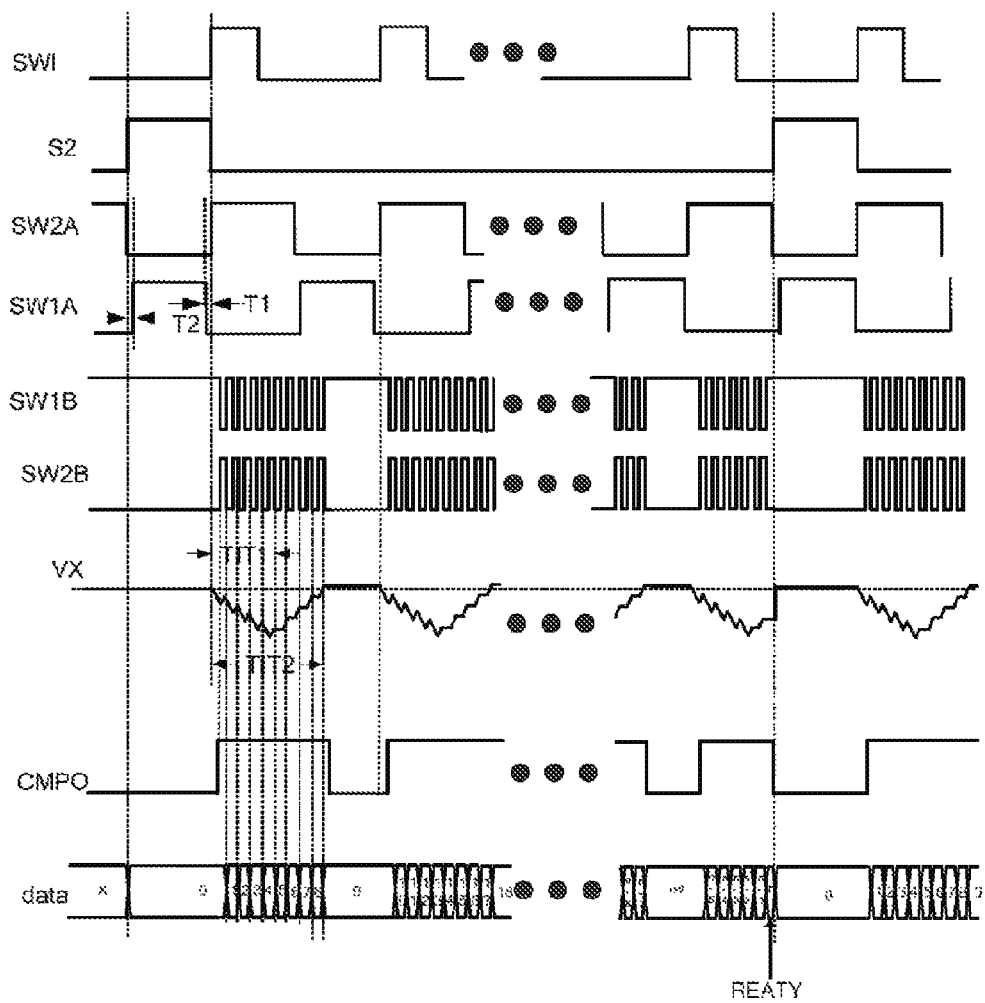
FIG. 2C illustrates a timing diagram of the related signals during the integral period TIT2 including the integral period TIT1 completely.

In this embodiment, the integral periods TIT2 and TIT1 can be partially overlapped. In fact, the integral period TIT2 can entirely include the integral period TIT1, and their timing diagrams of the related signals are shown in FIG. 2C.

In this embodiment, the capacitance measuring circuit 10 having the circuit structure shown in FIG. 2A is introduced; however, the capacitance measuring circuit in this embodiment can also have other circuit structure different from the circuit structure shown in FIG. 2A. In fact, the capacitance measuring circuit in this embodiment can have the circuit structure shown in FIG. 3.

Figure 3:
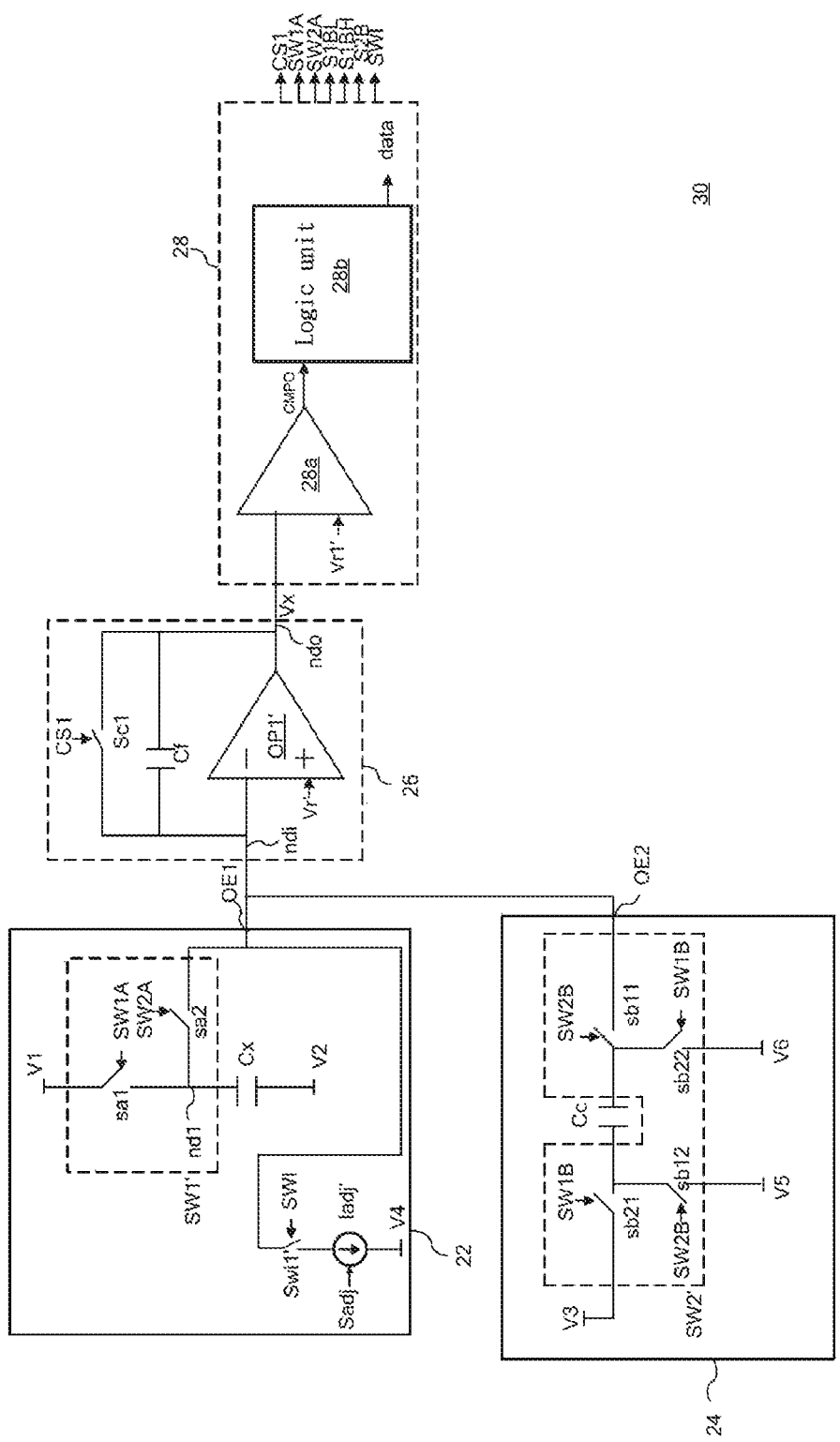
FIG. 3 illustrates a functional block diagram of the control circuit 24 in the capacitance measuring circuit 20 including the switches sb11, sb12, sb21 and sb22.

According to FIG. 3 and FIG. 2A, it can be found that the difference between the capacitance measuring circuit 20 shown in FIG. 3 and the capacitance measuring circuit 10 shown in FIG. 2A is that the switch circuit SW2' in the control circuit 24 of FIG. 3 includes the switches sb11, sb12, sb21 and sb22. Please refer to the above description about the capacitance measuring circuit 10 shown in FIG. 2A, if the reference voltages Vr' and Vr1' and the voltage V6 are practically equal to the voltage VDD/2, the voltages V3 and V1 are practically equal to the voltage VDD, and the voltages V5 and V2 are practically equal to the ground voltage, similar equations (9)~(12) can be obtained as follows:

$$Cx \times (V1 - V2) + Cf \times (Vr' - Vr') = \quad (9)$$
$$Cx \times (Vr' - V2) + I1 \times Ton + Cf \times (Vr' - Vx(t1))$$

$$\Delta V1 = \quad (10)$$
$$Vx(t1) - Vr' = \frac{1}{Cf} \times \left[\frac{(V2 - V1)}{2} \times Cx + (I1 \times Ton)\right] + Vr' - Vr' =$$
$$\frac{Cx \times (V2 - V1) + 2(I1 \times Ton)}{2 \times Cf} = \frac{(-Cx \times VDD) + 2(I1 \times Ton)}{2 \times Cf}$$

$$\Delta V2 = \frac{Cc \times (V3 - V5)}{Cf} = \frac{Cc \times (V1 - V2)}{Cf} = \frac{Cc \times VDD}{Cf} \quad (11)$$

$$Vr1' = Vr' = Vr' + N \times \Delta V1 + \sum_{j=1}^{N} Mj \times \Delta V2 \Rightarrow Cx - 2 \times \frac{(I1 \times Ton)}{(V1 - V2)} = \quad (12)$$
$$\frac{\left(\sum_{j=1}^{N} M_j\right) \times 2Cc}{N}$$

Thus, the capacitance measuring circuit 20 in FIG. 3 can perform integral operations similar to the capacitance measuring circuit 10 in FIG. 2A to finish the measurement of the capacitance of the capacitor Cx to be detected.

Figure 4A:
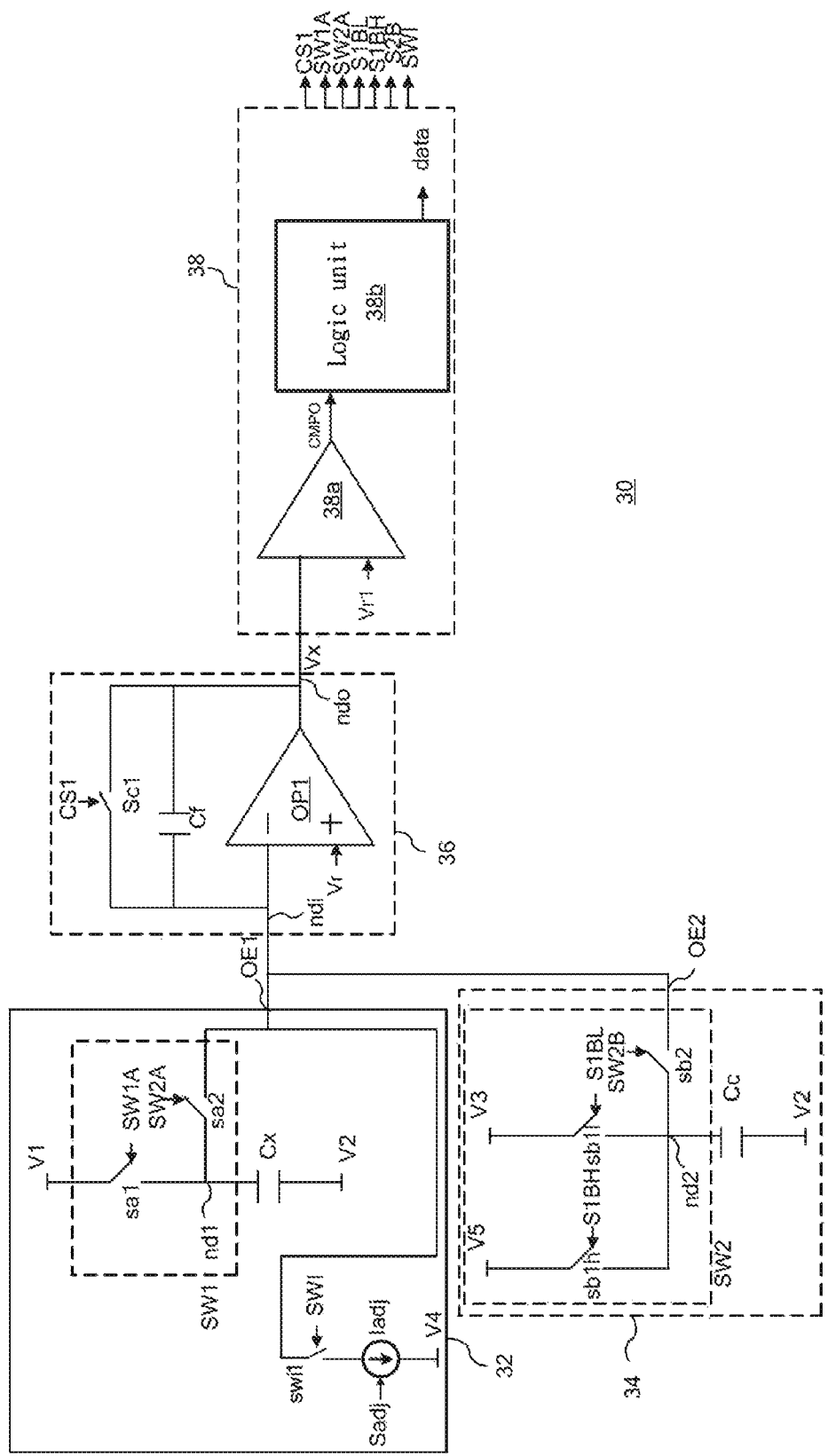
FIG. 4A illustrates a functional block diagram of the capacitance measuring circuit in the second embodiment of the invention.

Another preferred embodiment of the invention is also a capacitance measuring circuit. Please refer to FIG. 4A. FIG. 4A illustrates a schematic diagram of the capacitance measuring circuit in this embodiment. As shown in FIG. 4A, the capacitance measuring circuit 30 includes a first control circuit 32, a second control circuit 34, an integrator circuit 36 and a processor circuit 38. The first control circuit 32 and the second control circuit 34 are used to control the integrator circuit 36 to set the integral voltage Vx as the end level from the starting level and set the integral voltage Vx as the approximative starting level from the end level. For example, the starting level is equal to the reference voltage Vr and the level of the end level is lower than the starting level.

The processor circuit 38 is used to generate a corresponding signal to drive the first control circuit 32, the second control circuit 34 and the integrator circuit 36 to perform the above-mentioned operations and to respond the level variation of the integral voltage Vx to perform operation on the capacitance of the capacitor Cx to be detected and the operation result is the data signal data.

Next, the operations of the components in the capacitance measuring circuit 30 will be introduced in detail.

The difference between the capacitance measuring circuit 30 in this embodiment and the capacitance measuring circuit 10 in the above-mentioned embodiment is that the switch circuit SW2 in the capacitance measuring circuit 30 includes an additional switch Sb1h. One terminal of the switch Sb1h is coupled to the node nd2 and another terminal of the switch Sb1h is configured to receive the voltage V5. The switch sb1h is conducted by the enabling clock signal S1BH. The switch sb11 is equal to the switch sb1 in the capacitance measuring circuit 10.

In this embodiment, during the integral period TIT2, when the integral voltage Vx is lower than the reference voltage Vr1 of the comparator 38a (Vr1=Vr in this embodiment), the output of the comparator 38a has the logic level "1" and during the next half-cycle, the switch sb11 will be conducted by the enabling clock signal S1BL, and one terminal of the known capacitor Cc coupled to the node nd2 is charged or discharged to the voltage V3. In this embodiment, the voltage V3 is equal to the ground voltage GND.

During the still next half-cycle, the switch sb2 will be conducted by the enabling clock signal SW2B, and one terminal of the known capacitor Cc coupled to the node nd2 is coupled to the integral circuit input terminal ndi through the switch sb2 to increase the integral voltage Vx to approach the reference voltage Vr1.

On the contrary, when the integral voltage Vx is higher than the reference voltage Vr1 of the comparator 38a (Vr1=Vr in this embodiment), the output of the comparator 38a has the logic level "0" and during the next half-cycle, the switch sb1h will be conducted by the enabling clock signal S1BH, and one terminal of the known capacitor Cc coupled to the node nd2 is charged or discharged to the voltage V5. In this embodiment, the voltage V5 is equal to the voltage VDD. During the still next half-cycle, the switch sb2 will be conducted by the enabling clock signal SW2B, and one terminal of the known capacitor Cc coupled to the node nd2 is coupled to the integral circuit input terminal ndi through the switch sb2 to decrease the integral voltage Vx to approach the reference voltage Vr1. And, the capacitance of the capacitor Cx to be detected can be obtained according to the difference between the numbers counting the times that the output of the comparator 38a has the logic level "0" or "1" during the integral period TIT2.

Figure 4B:
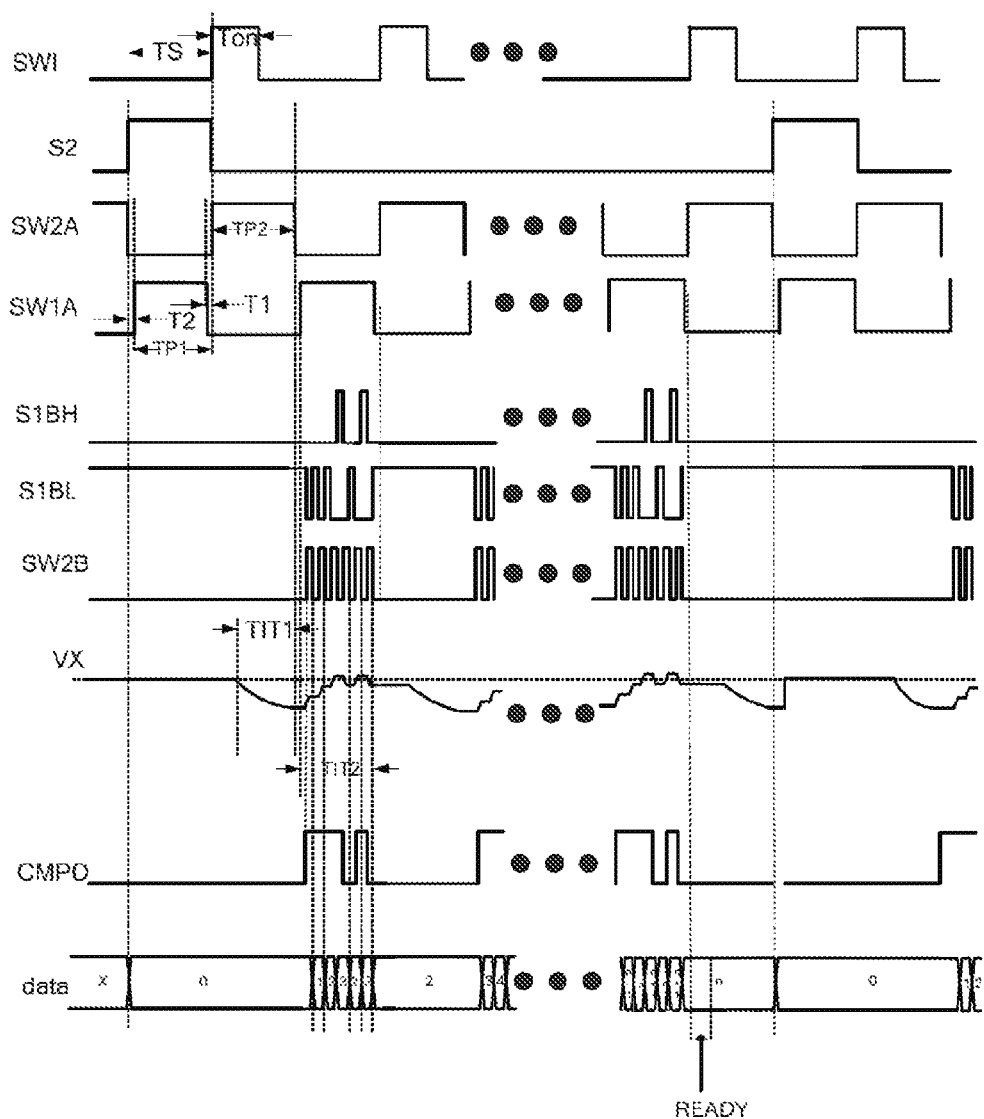
FIG. 4B illustrates a timing diagram of the related signals in the capacitance measuring circuit 30 in FIG. 4A.

In this embodiment, if the output of the comparator 38a has the logic level "1" during the integral period TIT2, then the processor circuit 38 will output the value of data signal +1; if the output of the comparator 38a has the logic level "0" during the integral period TIT2, then the processor circuit 38 will output the value of data signal −1. The value of data signal outputted by the processor circuit 38 is equivalent to the capacitance of the capacitor Cx to be detected subtracts a fixed value (e.g., the product of the equivalent current value I1 of the current source circuit Iadj and the charging/discharging time Ton). The timing diagrams of the related signals in the capacitance measuring circuit 30 are shown in FIG. 4B.

Figure 5A:
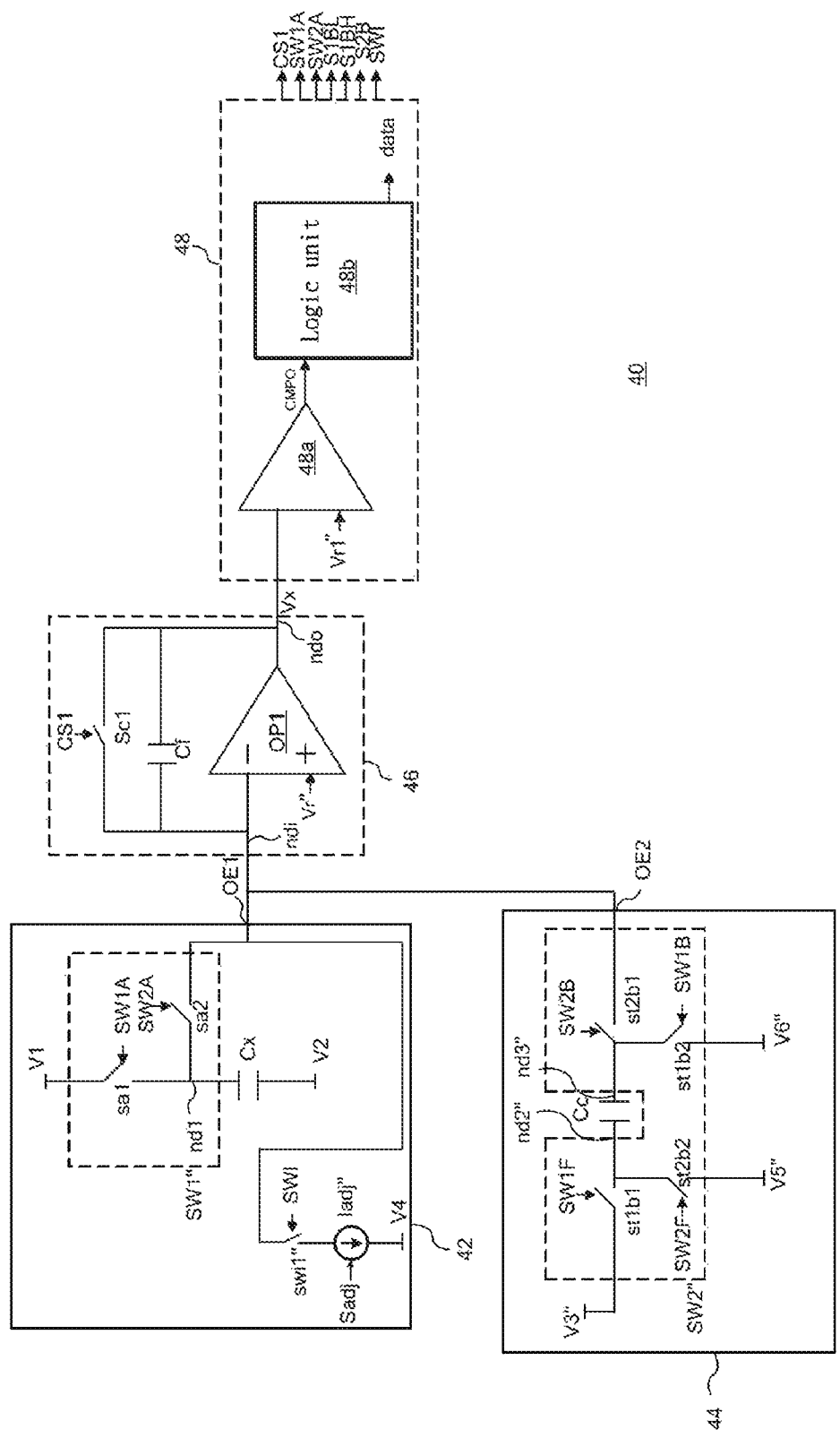
FIG. 5A illustrates a functional block diagram of the control circuit 44 in the capacitance measuring circuit 40 including the switches st1b1, st1b2, st2b1 and st2b2.

In this embodiment, the capacitance measuring circuit 30 having the circuit structure shown in FIG. 4A is introduced; however, the capacitance measuring circuit in this embodiment can also have other circuit structure different from the circuit structure shown in FIG. 4A. In fact, the capacitance measuring circuit in this embodiment can have the circuit structure shown in FIG. 5A.

The difference between the capacitance measuring circuit 40 and the capacitance measuring circuit 30 is that the switch circuit SW2" in the control circuit 44 includes the switches st1b1, st1b2, st2b1 and st2b2. Please refer to the above description about the capacitance measuring circuit 30, the reference voltages Vr" and Vr1" and the voltage V6" are practically equal to the voltage VDD/2, the voltage V3" is practically equal to the voltage VDD, and the voltage V5 is practically equal to the ground voltage.

Figure 5B:
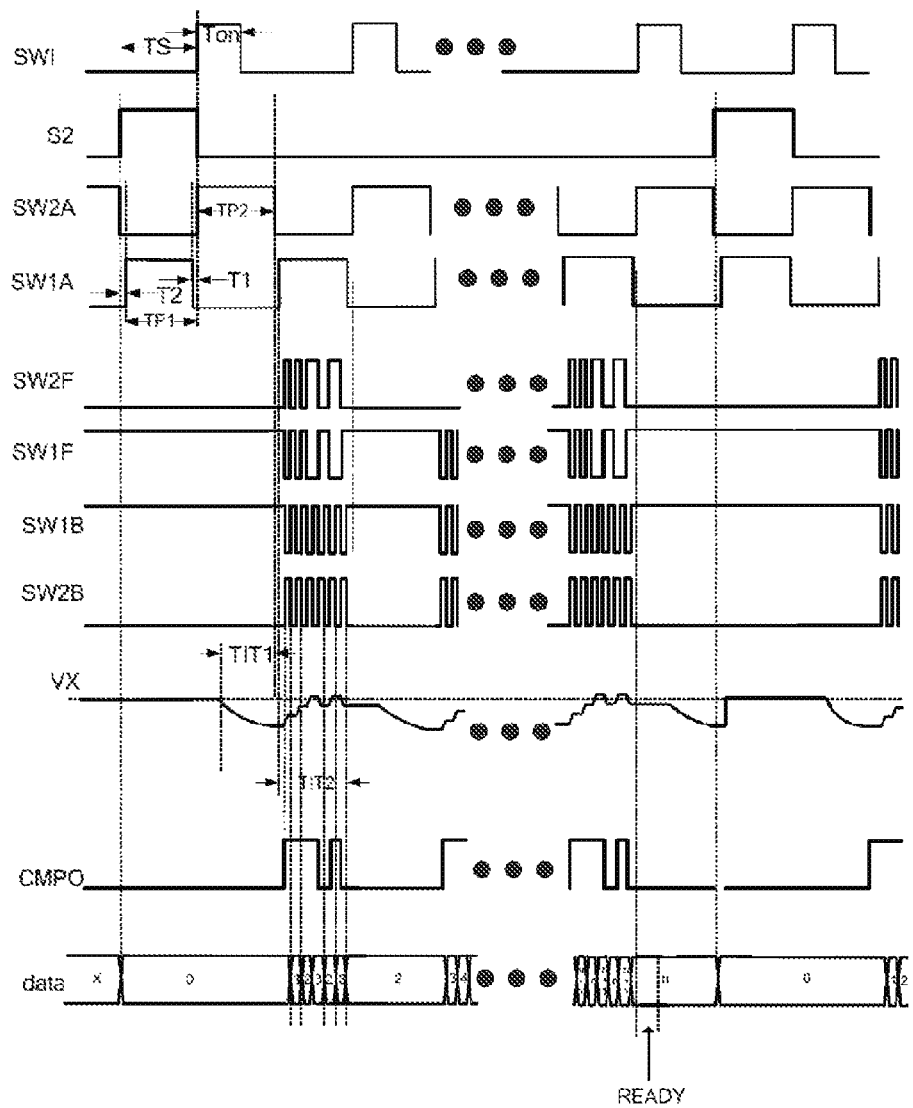
FIG. 5B illustrates a timing diagram of the related signals in the capacitance measuring circuit 40 in FIG. 5A.

During the integral period TIT2, when the integral voltage Vx is lower than the reference voltage Vr1" of the comparator 48a (Vr1"=Vr" in this embodiment), the output of the comparator 48a has the logic level "1" and during the next half-cycle, the switches st1b1 and st1b2 will be conducted by the enabling clock signals SW1F and SW1B respectively, and one terminal of the known capacitor Cc coupled to the node nd2" is charged or discharged to the voltage V3". In this embodiment, it is discharged to the ground voltage GND and one terminal of the known capacitor Cc coupled to the node nd3" is charged or discharged to the voltage V6". In this embodiment, it is discharged to the voltage VDD/2. During the still next half-cycle, the switches st2b2 and st2b1 will be conducted by the enabling clock signals SW2F and SW2B, and one terminal of the known capacitor Cc coupled to the node nd2" is coupled to the voltage V5 (the ground voltage) through the switch st2b2, and one terminal of the known capacitor Cc coupled to the node nd3" is coupled to the integral circuit input terminal ndi through the switch st2b1 to increase the integral voltage Vx to approach the reference voltage Vr1"; on the contrary, when the integral voltage Vx is higher than the reference voltage Vr1" of the comparator 48a (Vr1"=Vr" in this embodiment), the output of the comparator 48a has the logic level "0" and during the next half-cycle, the switches st2b2 and st1b2 will be conducted by the enabling clock signals SW2F and SW2B respectively, and one terminal of the known capacitor Cc coupled to the node nd2" is charged or discharged to the voltage V5". In this embodiment, the voltage V5" is equal to the ground voltage. During the still next half-cycle, the switches st1b1 and st2b1 will be conducted by the enabling clock signals SW1F and SW2B, and one terminal of the known capacitor Cc coupled to the node nd2" is charged or discharged to the voltage V3", and the voltage V3" is equal to the voltage VDD is this embodiment and one terminal of the known capacitor Cc coupled to the node nd3" is coupled to the integral circuit input terminal ndi through the switch st2b1 to decrease the integral voltage Vx to approach the reference voltage Vr1". And, the capacitance of the capacitor Cx to be detected can be obtained according to the difference between the numbers counting the times that the output of the comparator 48a has the logic level "0" or "1" during the integral period TIT2. In this embodiment, if the output of the comparator 48a has the logic level "1" during the integral period TIT2, then the processor circuit 48 will output the value of data signal +1; if the output of the comparator 48a has the logic level "0" during the integral period TIT2, then the processor circuit 48 will output the value of data signal −1. The value of data signal outputted by the processor circuit 48 is equivalent to the capacitance of the capacitor Cx to be detected subtracts a fixed value (e.g., the product of the equivalent current value I1 of the current source circuit Iadj" and the charging/discharging time Ton). The timing diagrams of the related signals in the capacitance measuring circuit 40 are shown in FIG. 5B.

Figure 6:
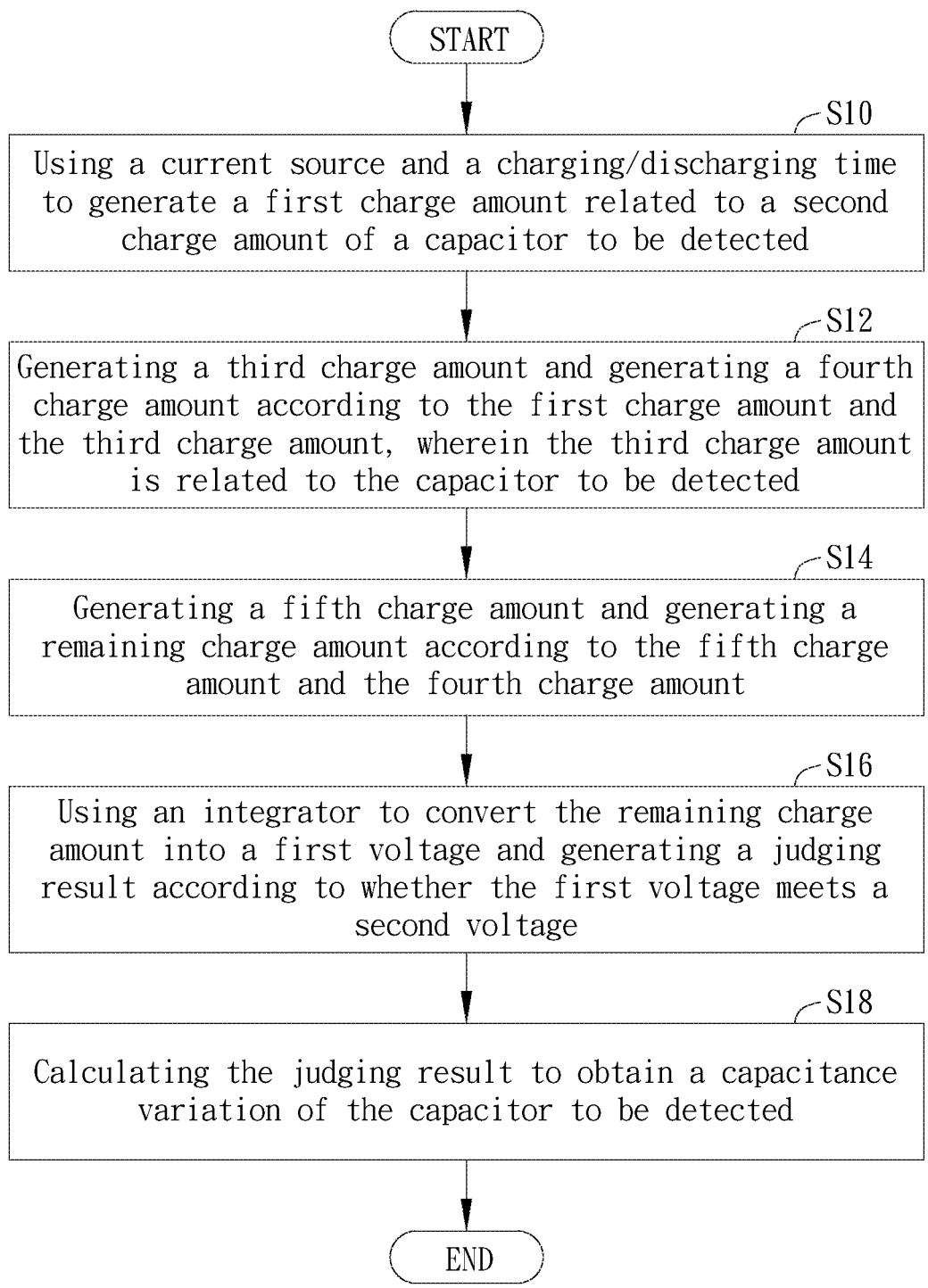
FIG. 6 illustrates a flowchart of the capacitance measuring method in another embodiment of the invention.

Another embodiment of the invention is a capacitance measuring method. Please refer to FIG. 6. FIG. 6 illustrates a flowchart of the capacitance measuring method in this embodiment. As shown in FIG. 6, the capacitance measuring method can include the following steps.

Step S10: using a current source and a charging/discharging time to generate a first charge amount related to a second charge amount of a capacitor to be detected;

Step S12: generating a third charge amount and generating a fourth charge amount according to the first charge amount and the third charge amount, wherein the third charge amount is related to the capacitor to be detected;

Step S14: generating a fifth charge amount and generating a remaining charge amount according to the fifth charge amount and the fourth charge amount;

Step S16: using an integrator to convert the remaining charge amount into a first voltage and generating a judging result according to whether the first voltage meets a second voltage; and Step S18: calculating the judging result to obtain a capacitance variation of the capacitor to be detected.

Compared to the prior arts, the capacitance measuring circuit and the capacitance measuring method of the invention uses the compensation current instead of the compensation capacitor, since the area of the current circuit is smaller than the area of the capacitor in the integrated circuit and the charge amount provided by the current circuit will be proportional to the current input/output time; therefore, the current that the current source should provide can be reduced by suitably controlling the switching time of the current source and increasing the current input/output time. Once the current source provides smaller current, the area of the current circuit can become smaller accordingly to largely reduce the area of the integrated circuit.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A capacitance measuring circuit, comprising:
    an integrator circuit comprising a first input terminal and a first output terminal, wherein there is an integral voltage on the first output terminal, the integrator circuit is used to respond to an enable level of a first control signal, and the integral voltage is set to a starting level;
    a first control circuit comprising a second output terminal, a capacitor to be detected and a current source circuit, wherein the second output terminal is electrically connected to the first input terminal, the current source circuit responds to a signal value of a setup signal to determine an equivalent current value related to an original capacitance before the capacitor to be detected is changed, the first control circuit is used to respond to a first set of clock signals to switch a voltage level on at least one terminal of the capacitor to be detected and conduct a current of the current source circuit to the second output terminal to perform a first adjusting operation;
    a second control circuit comprising a third output terminal and a known capacitor, wherein the third output terminal is electrically connected to the first input terminal, and the second control circuit is used to respond to a first set of clock signals to switch a voltage level on at least one terminal of the known capacitor to perform a second adjusting operation; and
    a processor circuit, electrically connected to the first control circuit and the second control circuit, for driving the first control circuit and the second control circuit to perform the first adjusting operation and the second adjusting operation respectively and calculating a number of times the second control circuit performs the second adjusting operation during a first integral period, and then obtaining a capacitance variation of the capacitor to be detected according to the number of times and the capacitance of the known capacitor.

2. The capacitance measuring circuit of claim 1, wherein the first adjusting operation is to adjust the integral voltage to a sum of a current level of the integral voltage and a first voltage difference.

3. The capacitance measuring circuit of claim 2, wherein the first voltage difference is related to a difference between the capacitance of the capacitor to be detected and a product of the equivalent current value and a charging/discharging time.

4. The capacitance measuring circuit of claim 1, wherein the second adjusting operation is to adjust the integral voltage to a sum of a current level of the integral voltage and a second voltage difference.

5. The capacitance measuring circuit of claim 1, wherein the processor circuit provides a first set of clock signals and a second set of clock signals to drive the first control circuit and the second control circuit to perform the first adjusting operation and the second adjusting operation respectively.

6. A capacitance measuring method, comprising steps of:
    using a current source and a charging/discharging time to generate a first charge amount related to a second charge amount of a capacitor to be detected;
    generating a third charge amount and generating a fourth charge amount according to the first charge amount and the third charge amount, wherein the third charge amount is related to the capacitor to be detected;
    generating a fifth charge amount and generating a remaining charge amount according to the fifth charge amount and the fourth charge amount;
    using an integrator to convert the remaining charge amount into a first voltage and generating a judging result according to whether the first voltage is equal to a second voltage; and
    calculating the judging result to obtain a capacitance variation of the capacitor to be detected.

7. The capacitance measuring method of claim 6, wherein before a capacitance of the capacitor to be detected is changed, the second charge amount is stored in the capacitor to be detected when the capacitor to be detected is charged to a first voltage level.

8. The capacitance measuring method of claim 7, wherein after the capacitance of the capacitor to be detected is changed, the third charge amount is stored in the capacitor to be detected when the capacitor to be detected is charged to the first voltage level.

9. The capacitance measuring method of claim 6, wherein the fourth charge amount is a residual charge amount after the first charge amount cancels out most of the third charge amount.

10. The capacitance measuring method of claim 6, wherein when a known capacitor is charged to a second voltage level, the fifth charge amount is stored in the known capacitor.

11. The capacitance measuring method of claim 6, further comprising a step of:
    determining whether the fifth charge amount is added into the remaining charge amount again according to the judging result.

* * * * *